US008987578B2

(12) United States Patent
Frazier et al.

(10) Patent No.: US 8,987,578 B2
(45) Date of Patent: Mar. 24, 2015

(54) ENERGY CONVERSION DEVICE

(75) Inventors: Gary A. Frazier, Garland, TX (US); Timothy J. Imholt, Methuen, MA (US); Alexander F. St. Claire, Dallas, TX (US)

(73) Assignee: Raytheon Company, Waltham, MA (US)

( * ) Notice: Subject to any disclaimer, the term of this patent is extended or adjusted under 35 U.S.C. 154(b) by 307 days.

(21) Appl. No.: 12/896,015

(22) Filed: Oct. 1, 2010

(65) Prior Publication Data

US 2012/0081013 A1 Apr. 5, 2012

(51) Int. Cl.

| | |
|---|---|
| ***H01L 29/66*** | (2006.01) |
| ***H05B 37/02*** | (2006.01) |
| ***G21H 1/00*** | (2006.01) |
| ***G21H 1/12*** | (2006.01) |

(52) U.S. Cl.

CPC ... *G21H 1/00* (2013.01); *G21H 1/12* (2013.01)
USPC ........... 136/202; 136/253; 136/254; 136/257; 136/258; 315/185 R; 315/362; 315/500; 310/302; 310/303; 310/308; 310/309

(58) Field of Classification Search

USPC .............. 315/149, 185 R, 362, 500; 136/202, 136/253, 254, 257, 258; 310/302, 303, 308, 310/309
See application file for complete search history.

(56) References Cited

U.S. PATENT DOCUMENTS

| | | | | | |
|---|---|---|---|---|---|
| 2,873,303 | A | * | 2/1959 | Rittner | 136/252 |
| 3,005,942 | A | | 10/1961 | Perdreaux, Jr. et al. | |
| 3,037,067 | A | * | 5/1962 | Bartolomei | 136/253 |
| 3,483,040 | A | | 12/1969 | Parkins | |
| 3,934,162 | A | * | 1/1976 | Adler et al. | 310/305 |
| 3,956,017 | A | * | 5/1976 | Shigemasa | 136/206 |
| 4,209,735 | A | * | 6/1980 | Yoshida | 320/101 |
| 4,656,565 | A | * | 4/1987 | Maglica | 362/187 |
| 5,111,099 | A | * | 5/1992 | Smith | 310/305 |
| 5,124,610 | A | | 6/1992 | Conley et al. | |
| 5,443,657 | A | | 8/1995 | Rivenburg et al. | |
| 5,606,213 | A | | 2/1997 | Kherani et al. | |
| 5,721,462 | A | * | 2/1998 | Shanks | 310/303 |
| 6,987,366 | B2 | * | 1/2006 | Yu | 315/291 |
| 7,301,254 | B1 | * | 11/2007 | Lal et al. | 310/309 |
| 8,201,963 | B2 | * | 6/2012 | Peterson | 362/183 |

(Continued)

FOREIGN PATENT DOCUMENTS

GB 1058678 A 2/1967

OTHER PUBLICATIONS

International Search Report; International Application No. PCT/US2011/054118; International Filing Date: Sep. 30, 2011; Date of Mailing: Feb. 2, 2012; pp. 1-5.

(Continued)

*Primary Examiner* — Douglas W Owens
*Assistant Examiner* — Thai Pham
(74) *Attorney, Agent, or Firm* — Cantor Colburn LLP

(57) ABSTRACT

According to one embodiment, an energy conversion device comprises a nuclear battery, a light source coupled to the nuclear battery and operable to receive electric energy from the nuclear battery and radiate electromagnetic energy, and a photocell operable to receive the radiated electromagnetic energy and convert the received electromagnetic energy into electric energy. The nuclear battery comprises a radioactive substance and a collector operable to receive particles emitted by the radioactive substance.

21 Claims, 5 Drawing Sheets

(56) References Cited

U.S. PATENT DOCUMENTS

| | | | | |
|---|---|---|---|---|
| 2001/0024500 | A1 * | 9/2001 | Sharpe | 379/424 |
| 2003/0067769 | A1 * | 4/2003 | Gilpin | 362/184 |
| 2004/0119440 | A1 * | 6/2004 | Cheng | 320/101 |
| 2006/0185719 | A1 | 8/2006 | Putnam | |
| 2006/0185720 | A1 | 8/2006 | Putnam | |
| 2006/0185721 | A1 | 8/2006 | Putnam | |
| 2006/0185723 | A1 | 8/2006 | Putnam | |
| 2008/0094047 | A1 | 4/2008 | Huynh et al. | |

OTHER PUBLICATIONS

International Search Report—Written Opinion; International Application No. PCT/US2011/054118; International Filing Date: Sep. 30, 2011; Date of Mailing: Feb. 2, 2012; pp. 1-7.

* cited by examiner

ENERGY CONVERSION DEVICE

TECHNICAL FIELD

This invention relates generally to the field of energy devices and more specifically to energy conversion devices.

BACKGROUND

Radioactive decay is the process in which an unstable atomic nucleus spontaneously loses energy by emitting ionizing particles and radiation. This decay, or loss of energy, results in an atom of one type, called the parent nuclide, transforming to an atom of a different type, named the daughter nuclide. A nuclide is an atomic species characterized by the specific constitution of its nucleus, i.e., by its number of protons, its number of neutrons, and its excited state. Isotopes are different types of atoms of the same chemical element, each having the same number of protons and a different number of neutrons.

SUMMARY OF THE DISCLOSURE

According to one embodiment, an energy conversion device comprises a nuclear battery, a light source coupled to the nuclear battery and operable to receive electric energy from the nuclear battery and radiate electromagnetic energy, and a photocell operable to receive the radiated electromagnetic energy and convert the received electromagnetic energy into electric energy. The nuclear battery comprises a radioactive substance and a collector operable to receive particles emitted by the radioactive substance.

Certain embodiments of the invention may provide one or more technical advantages. A technical advantage of one embodiment may include the capability to provide a longer-life battery that can be used in roughly the same mechanical and electrical manner as a conventional electrochemical battery. Another technical advantage of one embodiment may include the capability to provide low-voltage power from a nuclear power source. Yet another technical advantage of one embodiment may include the capability to provide power over an extended lifetime and eliminate the need of an on/off switch from some electronic devices.

Various embodiments of the invention may include none, some, or all of the above technical advantages. One or more other technical advantages may be readily apparent to one skilled in the art from the figures, descriptions, and claims included herein.

BRIEF DESCRIPTION OF THE DRAWINGS

For a more complete understanding of the present invention and its features and advantages, reference is now made to the following description, taken in conjunction with the accompanying drawings, in which.

DETAILED DESCRIPTION OF THE DRAWINGS

It should be understood at the outset that, although example implementations of embodiments of the invention are illustrated below, the present invention may be implemented using any number of techniques, whether currently known or not. The present invention should in no way be limited to the example implementations, drawings, and techniques illustrated below. Additionally, the drawings are not necessarily drawn to scale.

Electrochemical Cell Batteries

Electric power in batteries may be provided through electrochemical reactions inside an enclosure. Examples include AA and AAA batteries. Once a resistive load is attached to one or more of these batteries, they will discharge their electrochemical potential into that load. As that energy is dissipated into that load, the energy stored in the battery will deplete over an amount of time proportional to the load placed on the battery. A typical AA battery may have a maximum energy storage capacity of perhaps 10,000 Joules, which will be consumed over some period of time. Once depleted, the electrochemical cell battery must be either replaced or recharged. This process is very costly. Accordingly, teachings of certain embodiments recognize the capability to provide a longer-life battery that can be used in roughly the same mechanical and electrical manner as a conventional electrochemical battery.

Radioactive Decay Process

A radioactive substance is an unstable isotope which will be permanently transformed by some nuclear decay process. Example decay processes include alpha decay and beta decay. When that transformation occurs, an unstable isotope (in alpha and beta decay) will emit radiation in the form of a particle and in the process lose some energy, which will be taken out of that nucleus by the emitted particle. The nucleus will tend towards a more stable state; although the new nucleus may still be radioactive it is one step closer in the decay chain toward a stable isotope.

Alpha radiation is a form of nuclear fission in which an atom splits into two smaller atoms and releases kinetic and electrical energy. Alpha particles (the emitted particle involved in alpha radiation) are identical to the nucleus of a helium atom (two protons and two neutrons) with no attached electrons. There are many known sources of alpha radiation. One example is Americium-241, which is used in many types of smoke detectors.

Beta radiation is a form of nuclear decay in which an atom releases a beta particle. Beta radiation comes in two forms, beta minus which is the release of electrons, and beta plus which is the release of positrons. There are many natural sources of beta radiation in nature. One example is as tritium, an isotope of hydrogen.

Nuclear Power Sources

Figure 1:
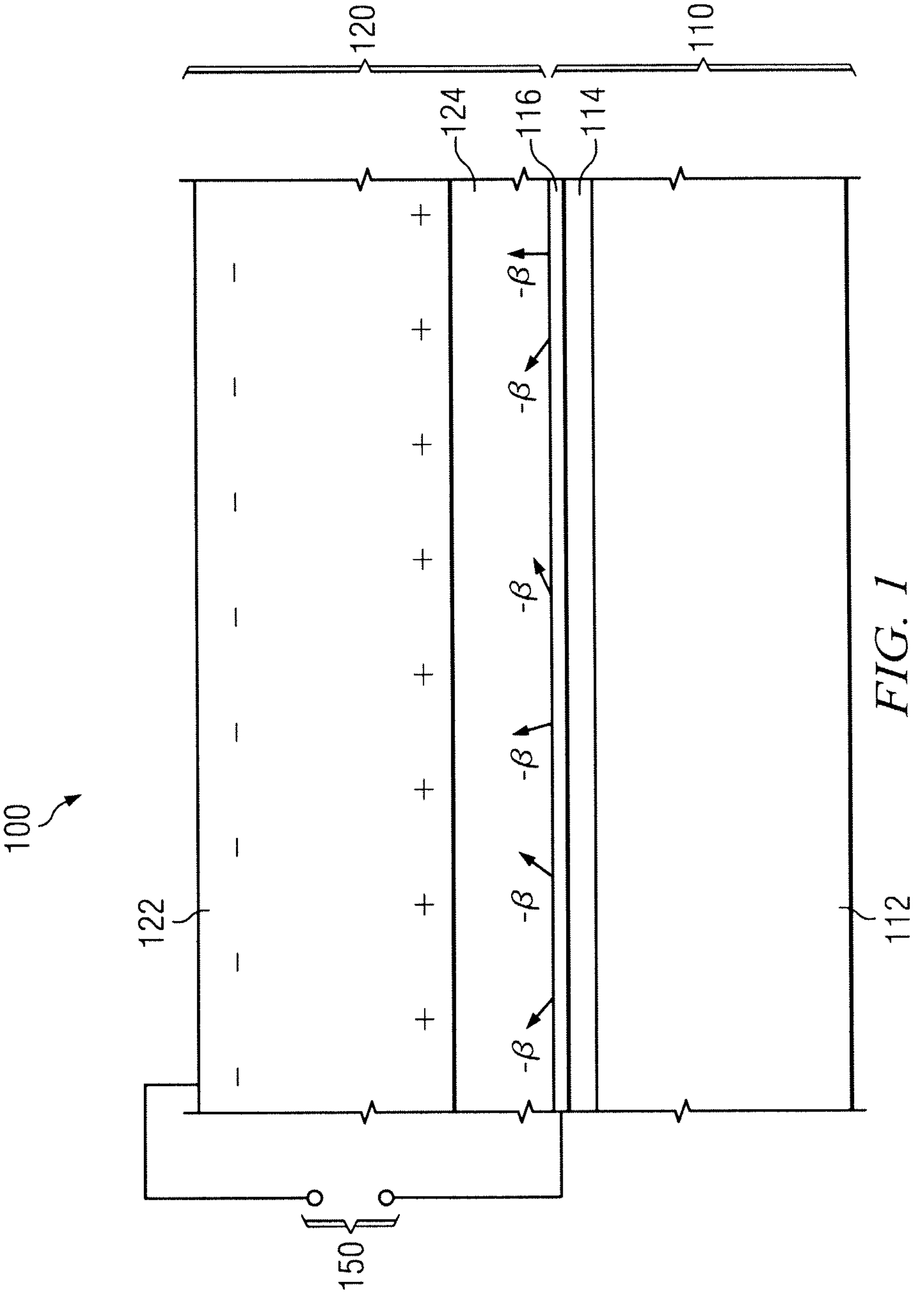
FIG. 1 shows an energy conversion system according to one embodiment.

FIG. 1 shows an energy conversion system 100 according to one embodiment. Energy conversion system 100 converts nuclear energy into electrical energy. Energy conversion system 100 features an energy source 110 and an energy collector 120.

Energy source 110 includes a substrate 112, a coating 114, and an emitting layer 116. In some examples, substrate 112 may be either a conductor, such as a metallic substrate, or an insulator, such as a plastic substrate. In the illustrated example, substrate 112 is a 250 μm-thick, stainless steel substrate, coating 114 is a 5 μm-thick polyimide coating, and emitting layer 116 is a 3 μm-thick nuclear source layer. In this example, emitting layer 116 is a radioactive substance that undergoes a nuclear decay process. Energy collector 120 includes a substrate 122 and a coating 124. In the illustrated example, substrate 122 is a 250 μm-thick, stainless steel disk, and coating 124 is a 25 μm-thick polyimide coating.

In some embodiments, energy source 110 and energy collector 120 are separated by some distance. Teachings of certain embodiments recognize that energy source 110 may emit particles that travel across this distance before striking energy collector 120. The distance may be of any suitable length. For example, teachings of certain embodiments recognize that the length of the distance may be optimized based on a desired capacitance across the distance. Also, teachings of certain embodiments recognize that the maximum length of the distance may be limited to the distance that particles can travel and still strike energy collector 120.

In operation, emitting layer 116 emits charged particles that strike a conductor, such as substrate 122. In the illustrated embodiment, the emitting layer 116 is applied to a second conductor, substrate 112. In some examples, substrate 112 acts as a support structure only; in other embodiments, substrate 112 may act as a second collector. As a result of electrical charge transfer, substrate 122 will acquire an electrical charge, and energy conversion system 100 will generate electric power 150.

In this example, energy source 110, which has an electrical charge, emits a particle such as a beta particle, and energy collector 120 struck by the particle acquires the opposite charge. This opposite charge may be opposite in both sign and magnitude. Teachings of certain embodiments recognize that the two electrodes may maintain a difference of potential for as long as charged particles are emitted from energy source 110 and these emissions strike energy collector 120. An electrical load may be attached to the two electrodes so that the separated charge from one electrode may pass through the load and recombine with the charge on its companion electrode. In this manner, energy source 110 that spontaneously emits charged particles may be made to provide an electric power source. Accordingly, teachings of certain embodiments recognize that a nuclear 'battery' may have many applications including the replacement of many disposable and rechargeable batteries now used in commercial and military applications.

However, for optimal efficiency, the voltage difference across the electrodes of a typical nuclear battery should be on the order of the energy of the particles emitted from the nuclear material. This voltage is typically very high, and such nuclear batteries tend to provide extremely high output voltage and extremely low output current.

For example, Tritium is a nuclear isotope that emits beta particles and photons with the beta particle carrying away roughly 5700 electron volts of kinetic energy. In order to obtain the maximum conversion efficiency of a nuclear battery based on the isotope of Tritium, the electrodes in this battery should be spaced so that they may be charged, via the absorption of the beta emissions, to slightly less than 5700 volts. If this is not the case, the particle will retain excess kinetic energy when it strikes the collection electrode; this excess kinetic energy will be lost as heat, light, or another form of energy.

In addition to optimizing the voltage difference based on the order of the energy of the particles emitted from the nuclear material, one may improve nuclear battery efficiency by matching the resistance of the load connected to the nuclear battery to the internal resistance of the battery. For example, if a layer of beta-emitting tritium material generates an assumed 1 milliampere of current, the internal resistance of an optimized tritium battery would be 5700 volts/0.001 amperes=5.7 megohms. Thus, optimal efficiency for power transfer from the battery would require the load to have a resistance of the same value (a matched load) of 5.7 megohms. However, many electrical devices require a much lower operating voltage and have a much lower load resistance. A typical AA battery has an output voltage of 1.5 volts and an internal resistance of less than 1 ohm.

Accordingly, teachings of certain embodiments recognize the capability to provide an efficient battery based on nuclear emissions with an output voltage commensurate with the requirements of modern battery-powered devices. Thus, teachings of certain embodiments recognize the capability to efficiently convert the high voltage output of a nuclear power source into lower voltage and lower effective internal resistance.

Figure 2:
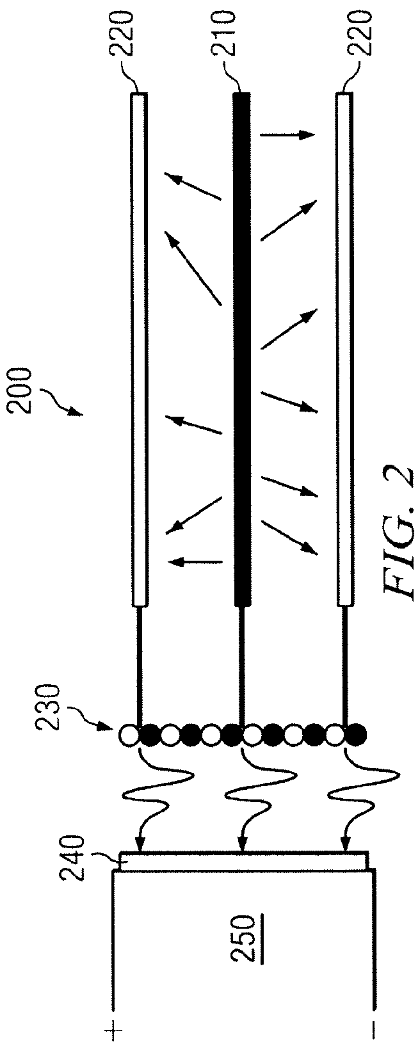
FIG. 2 shows an energy conversion system according to one embodiment.

FIG. 2 shows an energy conversion system 200 according to one embodiment. Energy conversion system 200 converts nuclear energy into electrical energy 250. Energy conversion system 200 features an energy source 210, one or more energy collectors 220, a light source 230, and a photocell 240.

In this example, energy source 210 is a radioactive substance that undergoes a nuclear decay process. Energy collectors 220 may represent any conductors configured to detect particles emitted by energy source 210. Examples of energy source 210 and collectors 220 may include energy source 110 and energy collector 120 of FIG. 1.

Light source 230 may represent any device operable to receive electric power from energy source 210 and/or energy collectors 220 and radiate electromagnetic energy, such as light. Examples of light source 230 may include light-emitting diodes (LEDs); laser diodes, such as vertical-cavity surface-emitting lasers (VCSELs); transverse electric lasers; and electroluminescence devices. Electroluminescence is an optical phenomenon and electrical phenomenon in which a material emits light as the result of radiative recombination of electrons and holes in a material, such as a semiconductor.

Light source 230 may include one or more individual light sources. For example, light source 230 may include multiple LEDs connected in a series such that the forward voltage of the series of diodes is equal to the electrical output voltage of energy source 210.

Photocell 240 may represent any device suitable to receive the radiated electromagnetic energy and convert the radiated electromagnetic energy into electric power 250. One example of photocell 240 may include a photovoltaic cell, such as a solar cell.

In operation, energy source 210 emits charged particles that strike energy collectors 220. As a result of electrical charge transfer, energy collectors 220 will acquire an electrical charge generate electric power. Light source 230 will receive this electric power and radiate electromagnetic energy. Photocell 240 receives the radiated electromagnetic energy and converts the electromagnetic energy into electric power 250.

Figure 3A:
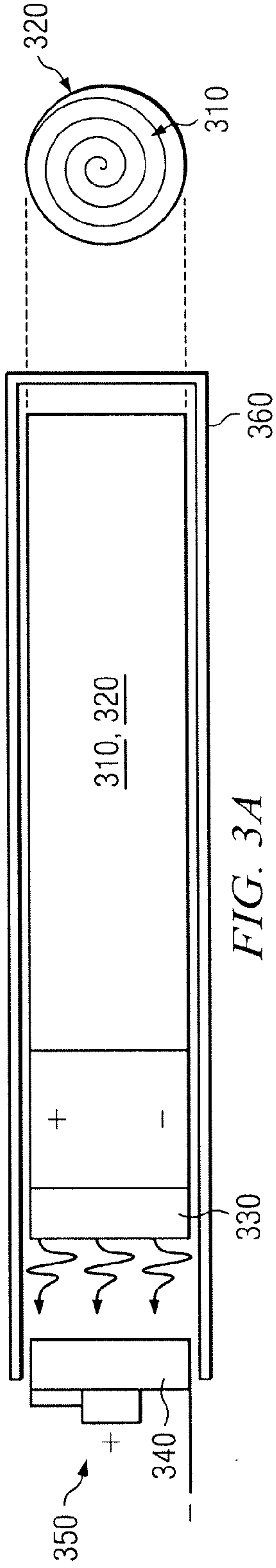
FIGS. 3A, 3B, and 3C shows a cylindrical energy conversion system according to one embodiment.
Figure 3B:
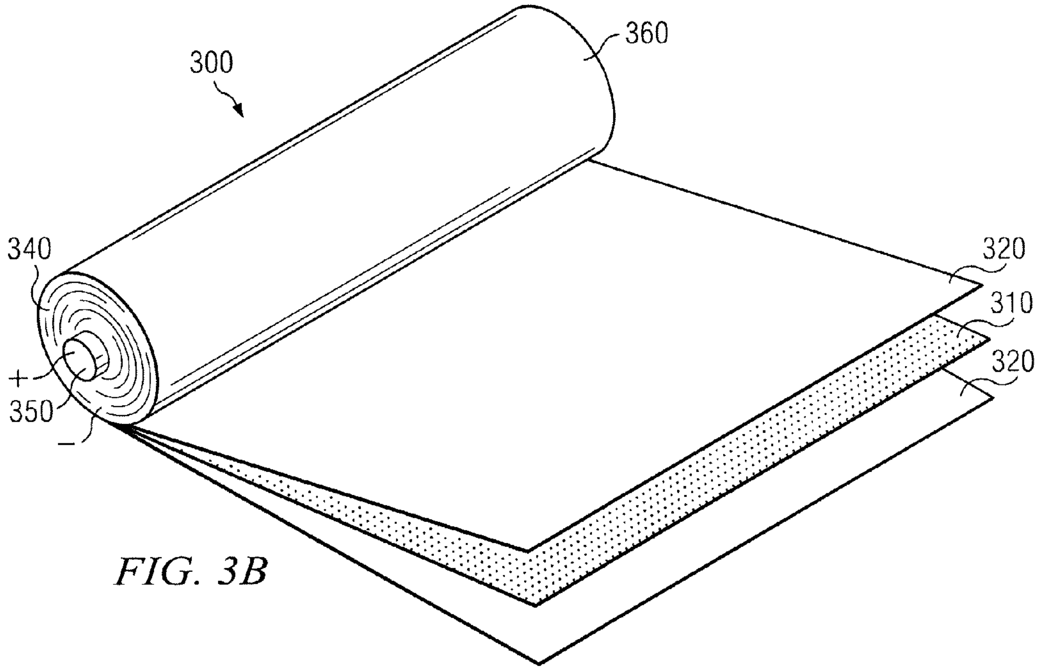
Figure 3C:
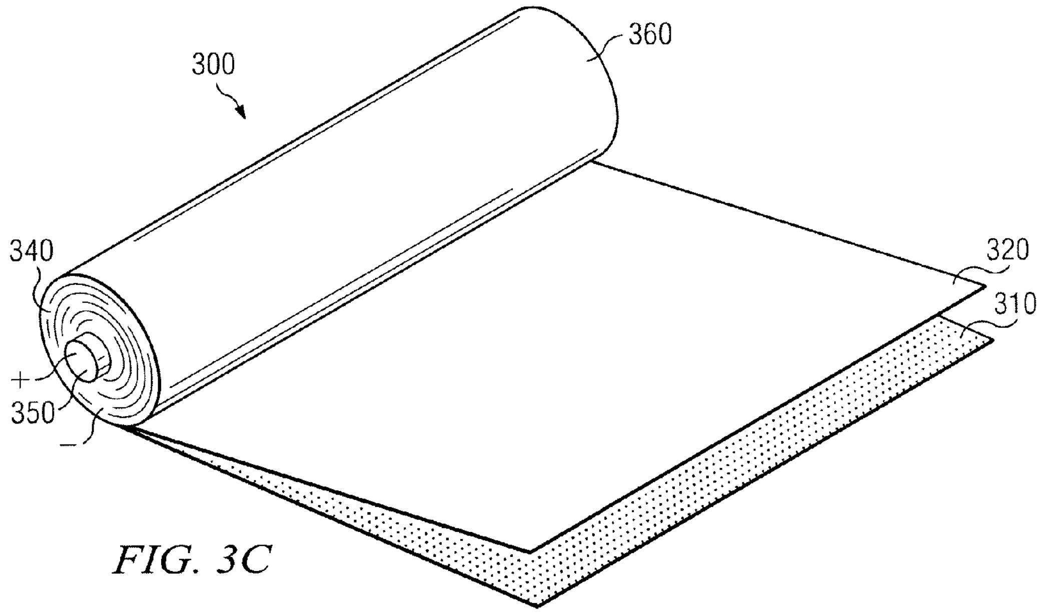

Energy conversion system 200 may be constructed in any suitable manner. For example, FIGS. 3A, 3B, and 3C show a cylindrical energy conversion system 300 according to one embodiment. Energy conversion system 300 converts nuclear energy into electrical energy 350. Energy conversion system 300 features an energy source 310, one or more energy collectors 320, a light source 330, and a photocell 340.

In this example embodiment, energy conversion system 300 is housed in a cylindrical body 360. Body 360 may be formed out of any suitable material. For example, in some embodiments, body 360 is a conductor, such as a metal body, or an insulator, such as a plastic body. In some embodiments, body 360 may act as an outer conductor and shield, absorbing particles from a radioactive material such as energy source 310 and shielding those particles from escaping outside energy conversion system 300.

In this example embodiment, energy source 310 and energy collectors 320 are shown as layers of material wrapped inside of body 360. For example, energy source 310 and energy collectors 320 may be rolled around each other and fit within body 360, as shown in FIG. 3A. However, teachings of certain embodiments recognize that energy source 310 and energy collectors 320 may be disposed within body 360 in any suitable manner.

Energy sources 310 and energy collectors 320 may be paired and arranged in any suitable manner. For example, the embodiment shown in FIG. 3B features energy source 310 disposed between two layers of energy collectors 320. In this example, when the energy source 310 and energy collectors 320 are rolled inside body 360, a cross-section of the roll would appear as follows: energy collector 320, energy source 310, energy collector 320, energy collector 320, energy source 310, energy collector 320, etc. Each energy collector 320 is situated between an energy source 310 and another energy collector 320, and each energy collector 320 only absorbs particles from the one adjacent energy source 310.

In another example, the embodiment shown in FIG. 3C features energy source 310 disposed next to one layer of energy collectors 320. In this example, when the energy source 310 and energy collector 320 are rolled inside body 360, a cross-section of the roll would appear as follows: energy collector 320, energy source 310, energy collector 320, energy source 310, energy collector 320, energy source 310, etc. Each energy collector 320 is situated between two energy sources 310, and each energy collector 320 absorbs particles from both adjacent energy sources 310.

FIGS. 3A, 3B, and 3C show example embodiments of layers of energy sources 310 and energy collectors 320 rolled inside of a cylindrical body 360. However, teachings of certain embodiments recognize that embodiments are not limited to a cylindrical body 360, but rather energy conversion device 300 may be of any suitable shape and dimensions.

Additionally, teachings of certain embodiments recognize that energy sources 310 and energy collectors 320 are not limited to being rolled together. Rather, energy sources 310 and energy collectors 320 may be arranged in any suitable manner.

Figure 4:
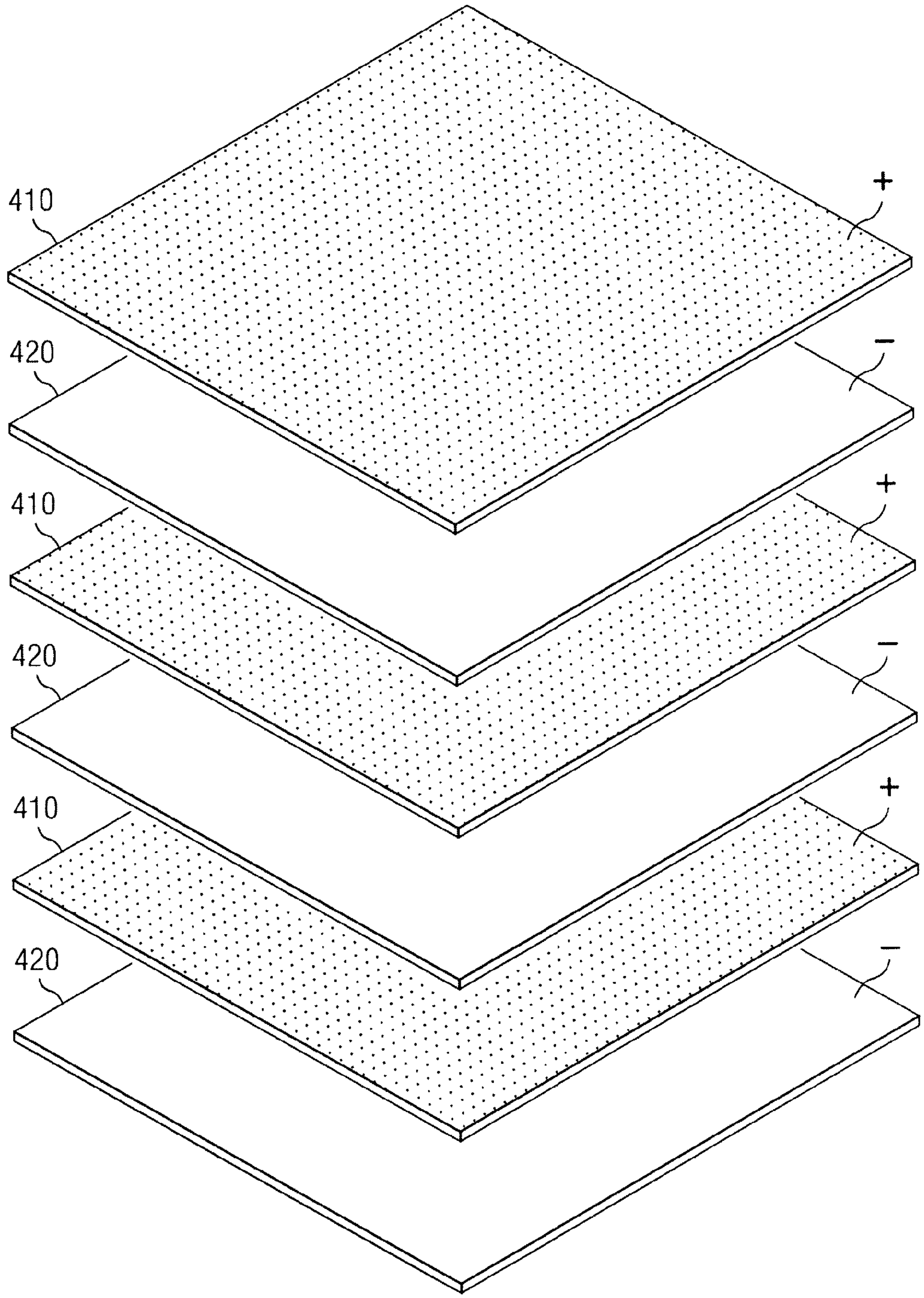
FIG. 4 shows stacked energy sources and energy collectors according to one embodiment.

For example, FIG. 4 shows stacked energy sources 410 and energy collectors 420 according to one embodiment. Unlike the examples shown in FIGS. 3A, 3B, and 3C, which features a single energy source 310 wrapped inside body 360, FIG. 4 shows multiple, discrete energy sources 410 stacked between multiple, discrete energy collectors 420.

Energy sources 410 and energy collectors 420 may be of any suitable shape or size. For example, in one embodiment, energy sources 410 and energy collectors 420 may be circular so as to fit inside the cylindrical body 360 of FIG. 3A. In another example embodiment, energy sources 410 and energy collectors 420 may be square or rectangular so as to fit inside a square or rectangular energy conversion device.

Figure 5:
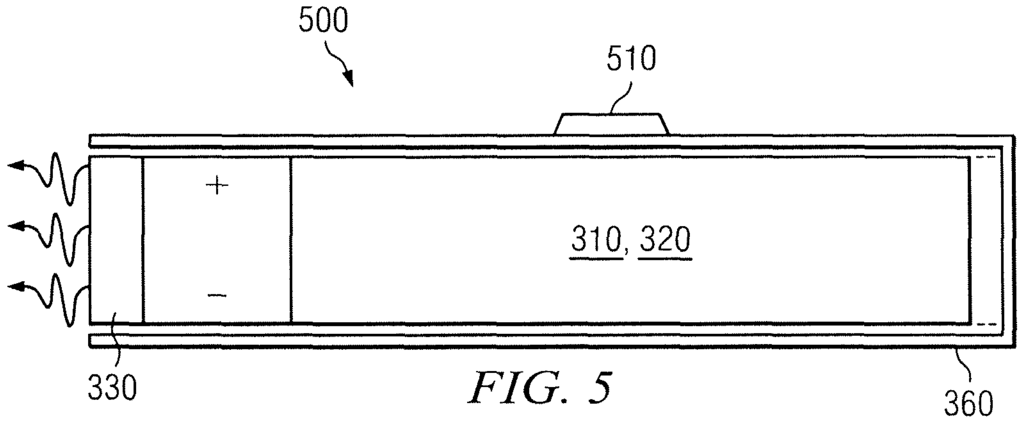
FIG. 5 shows an energy conversion system according to one embodiment.

FIG. 5 shows an energy conversion system 500 according to one embodiment. Energy conversion system 500 features energy source 310, one or more energy collectors 320, a light source 330, and a switch 510. Switch 510 may represent any switch configured to turn on and/or turn off energy conversion system 500. For example, in one embodiment, switch 510 may turn on and/or turn off light source 330. In some embodiments, energy conversion system 500 does not feature a switch 510.

Teachings of certain embodiments recognize that energy conversion system 500 may provide electromagnetic light energy for longer periods of time than traditional light sources, such as flashlights powered by alkaline, zinc-carbon, or lithium batteries. However, teachings of certain embodiments are not limited to flashlights; rather, energy conversion system 300 may be used to transmit light in any suitable environment for any suitable use.

In the embodiment of FIG. 5, energy conversion system 500 is cylindrical. However, teachings of certain embodiments recognize that energy conversion system 500 may be any suitable shape.

Modifications, additions, or omissions may be made to the systems and apparatuses described herein without departing from the scope of the invention. The components of the systems and apparatuses may be integrated or separated. Moreover, the operations of the systems and apparatuses may be performed by more, fewer, or other components. The methods may include more, fewer, or other steps. Additionally, steps may be performed in any suitable order. Additionally, operations of the systems and apparatuses may be performed using any suitable logic. As used in this document, "each" refers to each member of a set or each member of a subset of a set.

Although several embodiments have been illustrated and described in detail, it will be recognized that substitutions and alterations are possible without departing from the spirit and scope of the present invention, as defined by the appended claims.

To aid the Patent Office, and any readers of any patent issued on this application in interpreting the claims appended hereto, applicants wish to note that they do not intend any of the appended claims to invoke paragraph 6 of 35 U.S.C. §112 as it exists on the date of filing hereof unless the words "means for" or "step for" are explicitly used in the particular claim.

What is claimed is:

1. An energy conversion device, comprising:
- a nuclear battery comprising:
  - a radioactive substance, and
  - a collector operable to receive particles emitted by the radioactive substance;
- a light source continuously electrically connected to the nuclear battery and operable to continuously receive electric energy from the nuclear battery at a first voltage and radiate electromagnetic energy; and
- a photocell operable to receive the radiated electromagnetic energy and convert the received electromagnetic energy into electric energy at a second voltage that is different from the first voltage;
- wherein (a) the radioactive substance emits charged particles that strike the collector resulting in the collector acquiring an electrical charge to generate the electrical energy at the first voltage, (b) the light source receives the electrical energy at the first voltage and radiates the electromagnetic energy, and (c) the photocell receives the radiated electromagnetic energy and converts the radiated electromagnetic energy into the electric energy at the second voltage.

2. The energy conversion device of claim 1, wherein the electric energy from the photocell has a lower voltage than the electric energy from the nuclear battery.

3. The energy conversion device of claim 1, wherein the light source is one or more light-emitting diodes (LEDs) connected in a series such that the forward voltage of the series of LEDs is approximate to the voltage of the electric energy from the nuclear battery.

4. The energy conversion device of claim 1, wherein the light source is chosen from the group consisting of: a laser diode, an electroluminescence device, and a transverse electric laser.

5. The energy conversion device of claim 1, wherein the radioactive substance emits alpha radiation or beta radiation.

6. The energy conversion device of claim 1, wherein:
the collector comprises a first collector and a second collector, both the first collector and second collector being operable to receive particles emitted by the radioactive substance to acquire an electrical charge to generate the electric energy received by the light source; and
the radioactive substance is situated between the first collector and the second collector.

7. The energy conversion device of claim 1, further comprising a cylindrical body, wherein the radioactive substance and the collector are rolled to fit within the cylindrical body.

8. The energy conversion device of claim 1, wherein the nuclear battery provides the electric energy at a collector voltage on the order of the energy of the particles emitted.

9. The energy conversion device of claim 1, wherein the collector is configured to generate electric energy without the collector moving relative to the radioactive substance.

10. A nuclear-powered light source, comprising:
a nuclear battery comprising:
a radioactive substance, and
a collector operable to receive particles emitted by the radioactive substance and to provide electric energy at a collector voltage on the order of the energy of the particles emitted;
a light source continuously electrically connected to the nuclear battery and operable to continuously receive electric energy from the nuclear battery at the collector voltage and radiate electromagnetic energy;
a cylindrical body;
wherein the light source is disposed within the cylindrical body and the radioactive substance and the collector are rolled to fit within the cylindrical body, the collector being operable to receive particles emitted by the radioactive substance to acquire an electrical charge to generate at the collector voltage the electric energy received by the light source; and
wherein (a) the radioactive substance emits charged particles that strike the collector resulting in the collector acquiring an electrical charge to generate the electrical energy at the first voltage, (b) the light source receives the electrical energy at the first voltage and radiates the electromagnetic energy, and (c) the photocell receives the radiated electromagnetic energy and converts the radiated electromagnetic energy into the electric energy at the second voltage.

11. The nuclear-powered light source of claim 10, further comprising a switch coupled to the cylindrical body and configured to turn on and/or turn off the light source.

12. The nuclear-powered light source of claim 10, wherein the light source is one or more light-emitting diodes (LEDs) connected in a series such that the forward voltage of the series of LEDs is approximate to the voltage of the electric energy from the nuclear battery.

13. The nuclear-powered light source of claim 10, wherein the light source is chosen from the group consisting of: a laser diode, an electroluminescence device, and a transverse electric laser.

14. The nuclear-powered light source of claim 10, wherein the radioactive substance emits alpha radiation or beta radiation.

15. A method of converting energy, comprising:
receiving, at a collector, particles emitted by a radioactive substance;
transmitting electric energy at a first voltage continuously from the collector to a light source continuously electrically connected to the collector;
radiating, at the light source, electromagnetic energy by converting the electric energy into electromagnetic energy;
receiving the radiated electromagnetic energy at a photocell; and
converting the received electromagnetic energy into electric energy at a second voltage that is different from the first voltage;
wherein (a) the radioactive substance emits charged particles that strike the collector resulting in the collector acquiring an electrical charge to generate the electrical energy at the first voltage, (b) the light source receives the electrical energy at the first voltage and radiates the electromagnetic energy, and (c) the photocell receives the radiated electromagnetic energy and converts the radiated electromagnetic energy into the electric energy at the second voltage.

16. The method of claim 15, wherein the electric energy from the photocell has a lower voltage than the electric energy from the nuclear battery.

17. The method of claim 15, wherein the light source is one or more light-emitting diodes (LEDs) connected in a series such that the forward voltage of the series of LEDs is approximate to the voltage of the electric energy from the nuclear battery.

18. The method of claim 15, wherein the light source is chosen from the group consisting of: a laser diode, an electroluminescence device, and a transverse electric laser.

19. The method of claim 15, wherein the radioactive substance emits alpha radiation or beta radiation.

20. The method of claim 15, wherein:
the collector comprises a first collector and a second collector, both the first collector and second collector being operable to receive particles emitted by the radioactive substance to acquire an electrical charge to generate the electric energy received by the light source; and
the radioactive substance is situated between the first collector and the second collector.

21. The method of claim 15, wherein the radioactive substance and the collector are rolled to fit within a cylindrical body.

* * * * *